(12) United States Patent
Lowrey et al.

(10) Patent No.: US 6,667,900 B2
(45) Date of Patent: Dec. 23, 2003

(54) METHOD AND APPARATUS TO OPERATE A MEMORY CELL

(75) Inventors: Tyler Lowrey, San Jose, CA (US); Daniel Xu, Mountain View, CA (US)

(73) Assignee: Ovonyx, Inc., Boise, ID (US)

( * ) Notice: Subject to any disclaimer, the term of this patent is extended or adjusted under 35 U.S.C. 154(b) by 71 days.

(21) Appl. No.: 10/034,331

(22) Filed: Dec. 28, 2001

(65) Prior Publication Data

US 2003/0123284 A1 Jul. 3, 2003

(51) Int. Cl.⁷ .............................. G11C 11/15
(52) U.S. Cl. ....................... 365/171; 365/173
(58) Field of Search ................ 365/171, 173, 365/158, 189.09, 189.06

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,699,543 A | 10/1972 | Neale ................... 365/163 |
| 5,296,716 A | 3/1994 | Ovshinsky et al. |
| 5,789,758 A | 8/1998 | Reinberg |
| 5,818,749 A | 10/1998 | Harshfield ................. 365/105 |
| 5,879,955 A | 3/1999 | Gonzalez et al. |
| 5,883,827 A | 3/1999 | Morgan ................. 365/100 |
| 5,920,788 A | 7/1999 | Reinberg |
| 5,933,365 A | 8/1999 | Klersy et al. |
| 5,970,336 A | 10/1999 | Wolstenholme et al. |
| 5,998,244 A | 12/1999 | Wolstenholme et al. |
| 6,002,140 A | 12/1999 | Gonzalez et al. |
| 6,031,287 A | 2/2000 | Harshfield |
| 6,085,341 A | 7/2000 | Greason et al. |
| 6,087,674 A | 7/2000 | Ovshinsky et al. |
| 6,141,241 A | 10/2000 | Ovshinsky et al. |
| 6,153,890 A | 11/2000 | Wolstenholme et al. |
| 6,229,157 B1 | 5/2001 | Sandhu |

OTHER PUBLICATIONS

U.S. patent application, pending, Xu et al., 09/895,599, filed Jun. 29, 2001.
U.S. patent application, pending, Tyler Lowrey. 09/921,853, filed Aug. 2, 2001.

*Primary Examiner*—Vu Anh Le
(74) *Attorney, Agent, or Firm*—Trop, Pruner & Hu, P.C.

(57) ABSTRACT

Briefly, in accordance with an embodiment of the invention, a method and an apparatus to read a phase change memory is provided, wherein the method includes zero biasing unselected memory cells during reading of a selected memory cell.

23 Claims, 5 Drawing Sheets

US 6,667,900 B2

METHOD AND APPARATUS TO OPERATE A MEMORY CELL

BACKGROUND

While operating memory cells (e.g., during programming and reading of memory cells), a voltage potential may be applied to the selected or targeted memory cells to read or program the memory cell. During these operations, the states of the unselected memory cells in the array may be affected. To avoid disturbing unselected memory cells, a relatively large reverse bias may be applied to the unselected memory cells. However, this may result in relatively large reverse leakage currents in the unselected cells and may adversely affect the power consumption of the system.

Thus, there is a continuing need for better ways to operate memory cells in memory systems.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
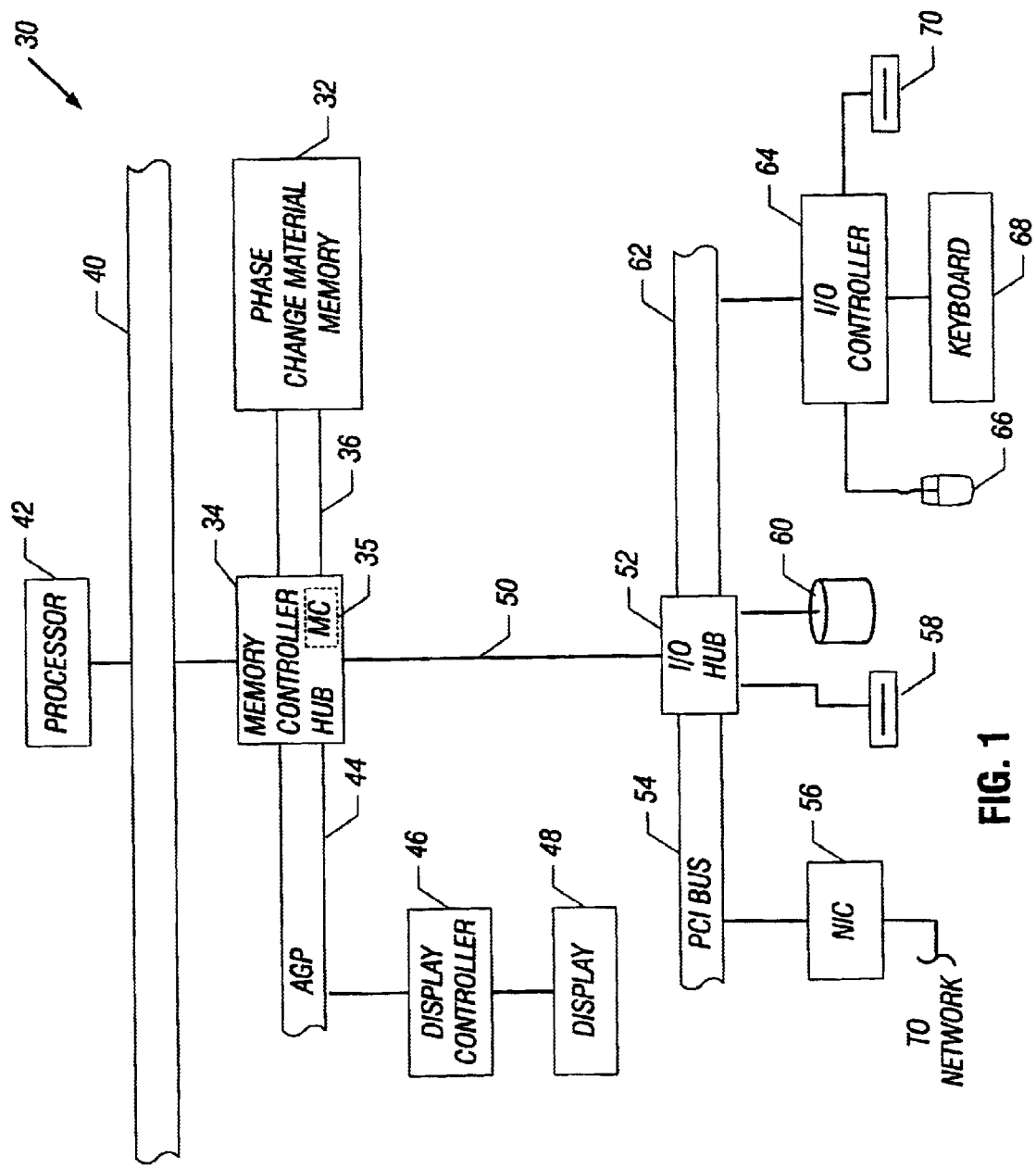
FIG. 1 is a block diagram of a computing system in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment 20 in accordance with the present invention is described. Embodiment 20 may comprise a computing system 30. Computing system 30 may be used in a variety of portable communication systems such as, for example, a mobile communication device (e.g., a cell phone), a two-way radio communication system, a one-way pager, a two-way pager, a personal communication system (PCS), a portable computer, a personal digital assistant (PDA), or the like. Although it should be pointed out that the scope and application of the present invention is in no way limited to these examples. For example, other applications where the present invention may be used are nonportable electronic applications, such as in cellular base stations, servers, desktop computers, video equipment, etc.

In this embodiment, computing system 30 may comprise a processor 42 that is connected to a system bus 40. Although the scope of the present invention is not limited in this respect, processor 42 may comprise, for example, one or more microprocessors, digital signal processors, microcontrollers, or the like. System bus 40 may be a data path comprising, for example, a collection of data lines to transmit data from one part of computing system 30 to another.

Computing system 30 may further include a memory controller hub 34 connected to system bus 40 and a display controller 46 coupled to memory controller hub 34 by an accelerated graphics port (AGP) bus 44. Display controller 46 may generate signals to drive a display 48.

Memory controller hub 34 may also be coupled to an input/output (I/O) hub 52 via a hub interface 50. I/O hub 52 may control operation of a CD-ROM drive 58 and may control operation of a hard disk drive 60. In addition, I/O hub 52 may provide interfaces to, for example, a peripheral component interconnect (PCI) bus 54 and an expansion bus 62. PCI bus 54 may be connected to a network interface card (NIC) 56. An I/O controller 64 may be connected to expansion bus 62 and may control operation of a floppy disk drive 70. In addition, I/O controller 64 may receive input from a mouse 66 and a keyboard 68.

Computing system 30 may also include a phase change memory 33 coupled to memory controller hub 34 via a memory bus 36. Memory controller hub 34 may include a memory controller 35 that may serve as an interface between memory bus 36 and system bus 40. Memory controller 35 may generate control signals, address signals, and data signals that may be associated with a particular write or read operation to phase change memory 33. Memory bus 36 may include communication lines for communicating data to and from phase change memory 33 as well as control and address lines used to store and retrieve data to and from phase change memory 33. A particular write or read operation may involve concurrently writing data to or reading data from phase change memory 33.

Although the scope of the present invention is not limited in this respect, phase change memory 33 may be a memory array comprising a plurality of memory cells that may include a volume of phase change memory material such as, for example, a chalcogenide material that may be programmed into different memory states to store data.

Figure 2:
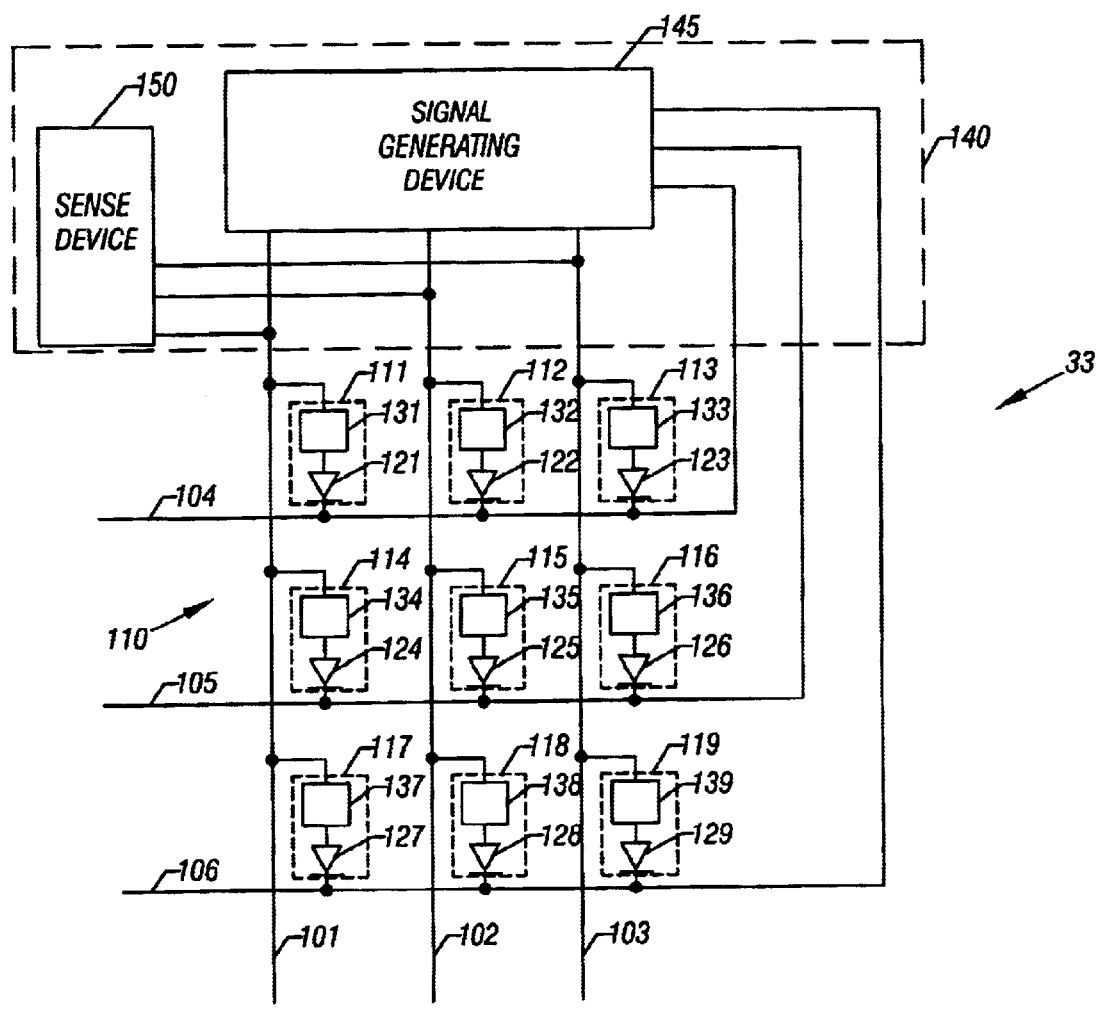
FIG. 2 is schematic diagram of a phase change memory in accordance with an embodiment of the present invention.

Turning to FIG. 2, an embodiment of phase change memory 33 in accordance with the present invention is described. Phase change memory 33 may include a 3×3 array 110 of memory cells 111–119, wherein memory cells 111–119 may respectively comprise diodes 121–129. Array 101 may be referred to as a diode-based memory array. In addition, memory cells 111–119 may respectively include structural phase change materials 131–139. Although a 3×3 array is illustrated in FIG. 2, the scope of the present invention is not limited in this respect. For example, phase change memory 33 may have a larger array of memory cells.

Phase change materials 131–139 may be, for example, a chalcogenide alloy that exhibits a reversible structural phase change from an amorphous state to a crystalline or a polycrystalline state. Due to the reversible structure, the phase change material may change from the amorphous state to the crystalline state and may revert back to the amorphous state thereafter, or vice versa, in response to temperature changes. A polycrystalline state may be defined as a state where multiple grain crystals are present with the possibility of some portions of the phase change material remaining amorphous.

A variety of phase change alloys may be used in memory cells 111–119. For example, a chalcogenide alloy containing one or more elements from Column VI of the periodic table may be used in memory cells 111–119. By way of example, phase change materials 131–139 may comprise GeSbTe alloys.

Phase change materials 131–139 may allow memory cells 111–119 to act as nonvolatile programmable resistors, which reversibly change between higher and lower resistance states. Crystallization in phase change materials 131–139 may be a function of both the temperature and the amount of time the material spends at that temperature. Accordingly, a phase change in memory cells 111–119 may be induced by resistive heating using a current flowing through phase change materials 131–139. The programmable resistor may exhibit a large dynamic range of resistivity between the crystalline state (low resistivity) and the amorphous state (high resistivity), and may also be capable of exhibiting multiple, intermediate states that allow multi-bit storage in a memory cell. In some embodiments, the programmable resistor may exhibit greater than 40 times dynamic range of resistivity between the crystalline and amorphous states. The data stored in the memory cells may be read by measuring the cell's resistance.

By way of example, in a binary system storing one bit of data, a first state may be defined as the "1" state or "set" state and a second state may be defined as the "0" state or the "reset" state, wherein the reset state may be defined as a substantially amorphous state and the set state may be defined as a substantially crystalline state.

Phase change memory 33 may also comprise column conductors 101, 102, and 103, and row conductors 104, 105, and 106 to select and bias a particular memory cell of array 110 during, for example, a write or read operation. The write operation may also be referred to as a programming operation, wherein a selected memory cell is programmed to a desired memory state. Column conductors 101–103 may be referred to as bitlines and row conductors 104–106 may be referred to as wordlines. The term "bias" may refer to applying a voltage potential difference across a device. Forward bias and reverse bias are relative terms that may be arbitrarily defined. For example, although the scope of the present invention is not limited in this respect, applying a forward bias to memory cell 111 may mean applying a relatively higher voltage potential to conductor 101 and a relatively lower voltage potential to conductor 104. Conversely, in this embodiment, applying a reverse bias to memory cell 111 may mean applying a relatively lower voltage potential to conductor 101 and a relatively higher voltage potential to conductor 104. Applying a zero bias to memory cell 111 may mean applying a potential difference of approximately zero volts across memory cell 111.

Figure 3:
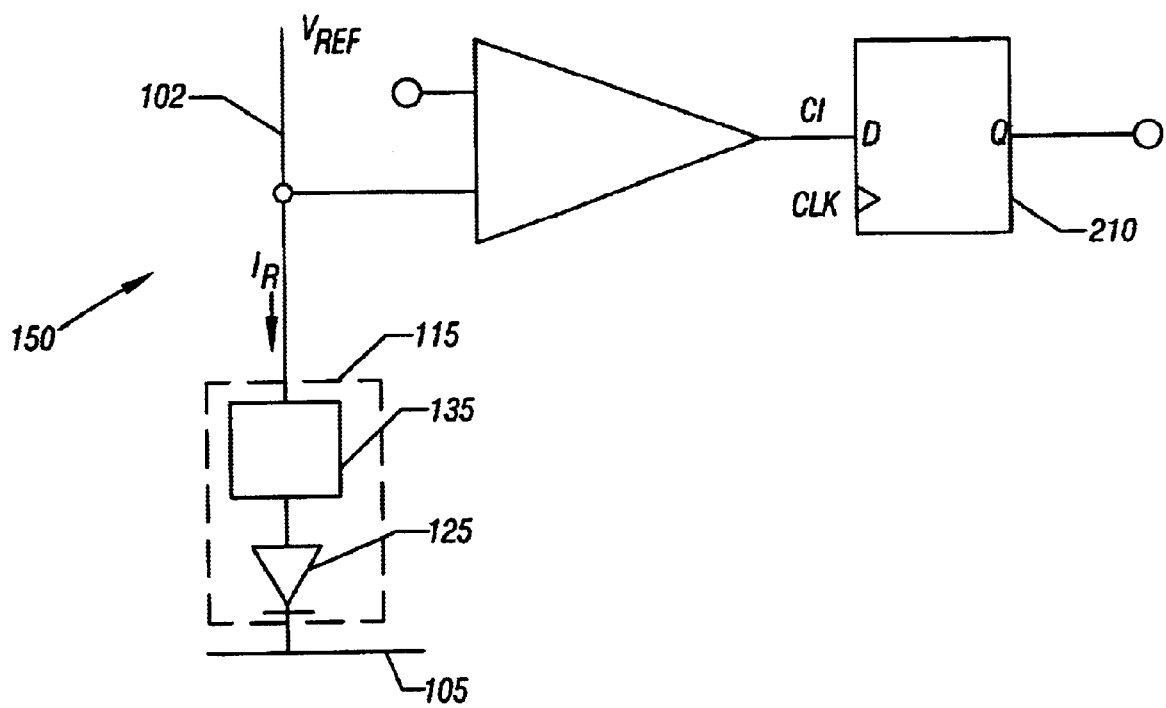
FIG. 3 illustrates a sense circuit in accordance with an embodiment of the present invention.

In this embodiment, phase change memory 33 may further comprise a control device 140 that may be used to control operation of memory cells 111–119. For example, control device 140 may be used to perform write and read operations to and from selected memory cells of array 110. Control device 140 may comprise a signal generating device 145 that may be used to generate bias signals (e.g., voltage potentials) to perform write and read operations. In addition, control device 140 may comprise a sense device 150 that may be used to determine whether the memory material in a memory cell is in a selected memory state after a programming signal is applied to the memory cell. FIG. 3 illustrates an embodiment of sense device 150 in accordance with the present invention.

Turning briefly to FIG. 3, although the scope of the present invention is not limited in this respect, a comparator 200 may be used to detect a memory state of a particular memory cell, e.g., memory cell 115. The noninverting input terminal of a comparator 200 may be connected to memory cell 115 to receive an indication of the resistance of memory cell 115. The inverting input terminal of comparator 200 may be connected to a reference voltage signal of $V_{REF}$. The output terminal of comparator 200 may be connected to the D input terminal of a D flip-flop 210. A read current, labeled $I_R$, may be used to generate a read voltage that may be received at the noninverting input terminal of comparator 200. The read voltage may be indicative of the resistance of memory cell 115, and therefore, may be used to indicate the state of memory cell 115. For example, the read voltage may be proportional to the resistance exhibited by the memory cell. Thus, a higher voltage may indicate that the cell is in a higher resistance state, e.g., a substantially amorphous state; and a lower voltage may indicate that the cell is in a lower resistance state, e.g., a polycrystalline state.

The comparison of the read voltage to the reference voltage $V_{REF}$ may result in an output signal C1 at the output of comparator 200 that may be used to indicate the state of memory cell 115 and may be stored in flip-flop 210.

Referring back to FIG. 2, during a write operation, a selected memory cell may be programmed to a selected state (e.g., a set or reset state) by forward biasing the selected memory cell to a level sufficient to program the selected memory cell to the selected state. The level sufficient to program a targeted memory cell may be referred to as the targeted memory cell's programming threshold level. Programming of a selected memory cell may be accomplished by, for example, applying a relatively low voltage potential to the wordline connected to the selected memory cell, and applying a relatively high voltage potential to the bitline connected to the selected memory cell.

If the difference between the relatively high voltage potential and the relatively low voltage potential is greater than the conductive threshold or turn-on voltage of a diode within the selected memory cell, then applying voltage potentials in this manner forward biases the selected memory cell to drive current through the memory cell. If sufficiently large, the current through the cell may program the selected memory cell to the selected memory state.

The wordline connected to the selected memory cell may be referred to as the selected wordline and the bitline connected to the selected memory cell may be referred to as the selected bitline. A memory cell of an array not connected to both a selected bitline and a selected wordline may be referred to as an unselected memory cell. Further, the bitline not connected to the selected memory cell may be referred to as an unselected bitline and the wordline not connected to the selected memory cell may be referred to as an unselected wordline.

By way of example, memory cell 115 may have a programming threshold voltage potential of approximately 1.5 volts. A voltage potential of approximately 2.5 volts may be sufficient to program the state of phase change material 135 to a reset state of "0," and a voltage potential of approximately 1.8 volts may be sufficient to program the state of phase change material 135 to a set state of "1." Programming memory cell 115 may include subjecting conductor 102 to a voltage potential of $V_{HI}$ and conductor 105 to a voltage potential of $V_{LO}$. If the potential difference between $V_{HI}$-$V_{LO}$ is greater than the programming threshold of memory cell 115, then memory cell 115 may be programmed to the desired state. Signal generating device 145 may include timing and drive circuitry to provide bias signals $V_{HI}$ and $V_{LO}$ to conductors 102 and 105, respectively.

As an example, $V_{HI}$ may be approximately 2.5 volts and $V_{LO}$ may be approximately 0 and therefore, the potential difference across memory cell 115 is approximately 2.5 volts. Since the programming threshold of memory cell 115 is approximately 1.5 volts, the potential difference of approximately 2.5 volts across memory cell 115 forward biases memory cell 115 and may be sufficient to program memory cell 115 to a reset state. In this example of a write operation, memory cell 115 may be referred to as the selected or targeted memory cell, conductors 102 and 105 may be referred to as a selected bitline and a selected wordline, respectively. In addition, conductors 101 and 103 may be referred to as unselected bitlines and conductors 104 and 106 may be referred to as unselected wordlines. Further, memory cells 111, 113, 117, and 119 are not connected to conductors 102 and 105, and may be referred to as unselected memory cells. Even though memory cells 112 and 118 are connected to selected bitline 102, these cells may be referred to as unselected memory cells since these cells are not connected to selected wordline 105. Similarly, even though memory cells 114 and 116 are connected to selected wordline 105, these cells may be referred to as unselected memory cells since these cells are not connected to selected bitline 102.

During a read operation, the state of memory cell 115 may be determined by forward biasing memory cell 115 via conductors 102 and 105. For example, forward biasing memory cell 115 may be accomplished by applying a voltage potential of $V_{read}$ to conductor 102 and a relatively lower voltage potential of $V_{lo}$ to conductor 105. If the potential difference across memory cell 115 is less than the programming threshold level of memory cell 115 and is greater than a turn-on voltage of diode 125, then a read current may be generated to pass through memory cell 115 and may be used to determine the resistance and state of memory cell 115. In this example, sense device 150 may be used to determine the resistance of memory cell 115. As an example, the programming threshold of memory cell 115 may be approximately 1.5 volts, $V_{read}$ may be approximately 1 volt, and $V_{lo}$ may be approximately 0 volts, so that a potential difference of approximately 1 volt is applied across memory cell 115. In this example, the potential difference of approximately 1 volt across memory cell 115 may be sufficient to generate a read current and may be insufficient to disturb the state of memory cell 115 since the potential difference of approximately 1 volt is less than the programming threshold of memory cell 115. In this example of a read operation, memory cell 115 may be referred to as a selected memory cell, conductors 102 and 105 may be referred to as a selected bitline and a selected wordline, respectively. In addition, conductors 101 and 103 may be referred to as unselected bitlines and conductors 104 and 106 may be referred to as unselected wordlines. Memory cells 111, 112, 113, 114, 116, 117, 118, and 119 may be referred to as unselected memory cells.

In this embodiment, during reading of memory cell 115, in addition to generating $V_{read}$ and $V_{lo}$, signal generating device 145 may generate bias signals to apply to unselected memory cells 111, 112, 113, 114, 116, 117, 118, and 119. The voltage potentials of these bias signals applied to the unselected memory cells may be selected so as to not disturb the stored data in the unselected memory cells. For example, during reading of memory cell 115, the voltage potentials of the bias signals applied to unselected conductors 101, 103, 104, and 106 may be chosen so as to apply a zero bias to unselected memory cells 111, 113, 117, and 119. In this embodiment, applying a zero bias to unselected memory cells 111, 113, 117, and 119 may be accomplished by applying the same voltage potential to unselected conductors 101, 103, 104, and 106. For example, a voltage potential of approximately 0.6 volts may be applied to conductors 101, 103, 104, and 106. In this embodiment, a potential difference of approximately 0 volts is applied across unselected memory cells 111, 113, 117, and 119. If a voltage potential of approximately 0.6 volts is applied to unselected conductors 101, 103, 104, and 106, and voltage potentials of approximately 1 volt and 0 volts are applied to selected conductors 102 and 105, respectively, then a potential difference of approximately 0.6 volts is applied across memory cells 114 and 116 and a potential difference of approximately 0.4 volts is applied across memory cells 112 and 118. If the turn-on voltage of diodes 121–129 is greater than, for example, 0.7 volts, then unselected memory cells 112, 114, 116, and 118 may not be disturbed during reading of memory cell 115 since the bias applied to these cells is less than their programming threshold. Reading memory cells in this manner may reduce leakage currents in array 110 since relatively low voltage potentials are applied across the unselected memory cells during reading of a selected memory cell.

In alternate embodiments, applying a zero bias to unselected memory cells 111, 113, 117, and 119 may be accomplished by floating unselected conductors 101, 103, 104, and 106. As an example, floating a conductor may be accomplished by disconnecting or decoupling the conductor from a source of operating potential so that no voltage potentials are applied to conductor 101, although the scope of the present invention is not limited in this respect. The drive circuit illustrated in FIG. 4 may be used to illustrate the floating of conductor 101.

Figure 4:
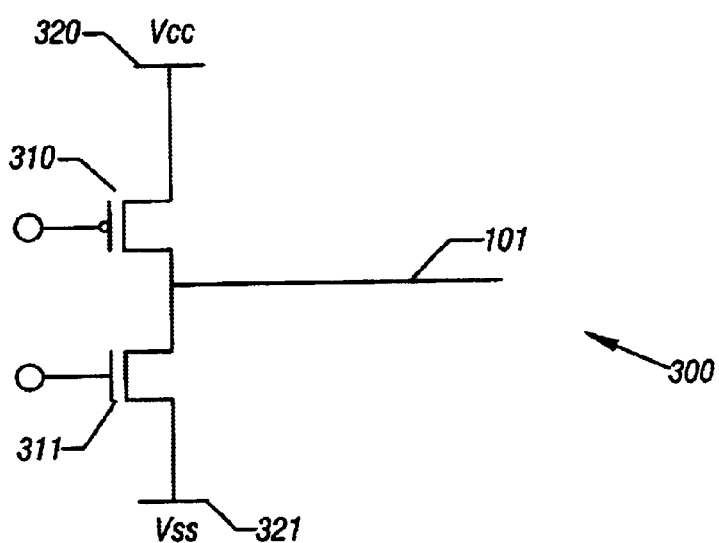
FIG. 4 illustrates a drive circuit in accordance with an embodiment of the present invention.

Turning to FIG. 4, an embodiment of a drive circuit 300 in accordance with the present invention is illustrated. Signal generating device 145 (FIG. 2) may include drive circuit 300 to provide a bias signal to conductor 101. In this example, drive circuit 300 may comprise a stacked p-channel 310 and n-channel 311 metal oxide semiconductor field effect transistors (MOSFET) having drain terminals connected to conductor 101 to apply a voltage potential to conductor 101. The source terminals of transistors 310 and 311 are connected to power supply terminals 320 and 321, respectively. Power supply terminal 320 may be connected to a source of operating potential, such as, for example, a voltage potential of Vcc, and power supply terminal 321 may be connected to a source of operating potential, such as, for example, a voltage potential of Vss.

In some embodiments, the floating of conductor 101 may be accomplished by applying by a relatively high impedance between conductor 101 and power supply terminals 320 and 321. For example, a relatively high impedance may be obtained by placing transistors 310 and 311 in cutoff mode. In other words, transistors 310 and 311 may be turned off or placed in a nonconducting mode of operation. As illustrated, some embodiments may reduce the power consumption of array 110 (FIG. 2) by decoupling or disconnecting a power supply potential from the conductors of array 110.

Figure 5:
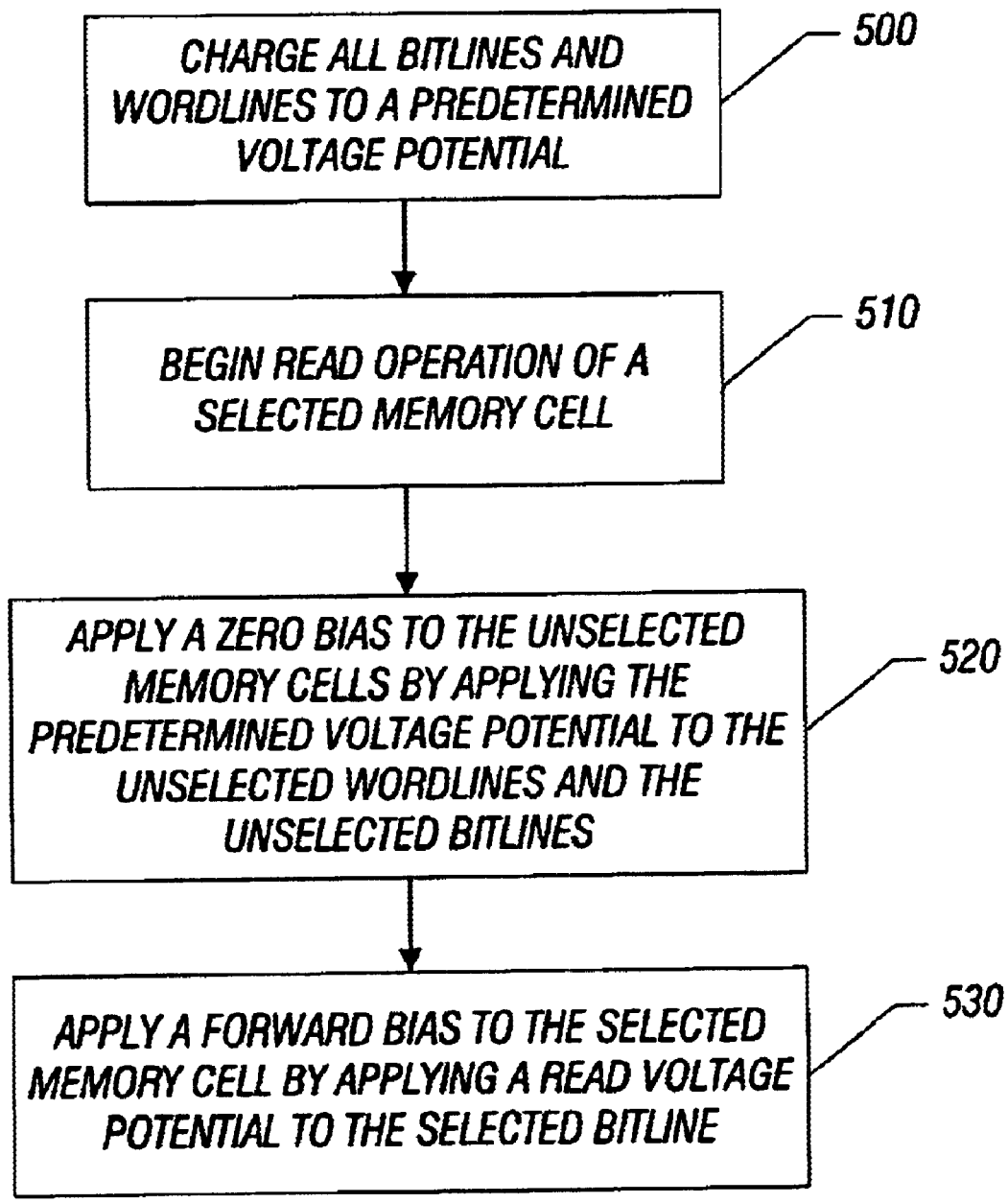
FIG. 5 is a flow chart of a method to operate a memory cell in accordance with an embodiment of the present invention.

Referring to FIG. 5, a method to operate a memory cell in accordance with an embodiment of the present invention is provided. This method may be illustrated using phase change memory 33 (FIG. 2). This embodiment may begin with charging all the bitlines and wordlines (e.g., conductors 101–106) of a memory array to a predetermined voltage potential (e.g., approximately 0.6 volts), block 500. The charging may occur during a standby or idle mode of operation, e.g., prior to or after the writing and reading operations, and may be referred to as a precharging operation.

A read operation of a selected memory cell (e.g., memory cell 115) biased via a selected wordline (e.g., conductor 105) and a selected bitline (e.g, conductor 102) may be initiated after the charging of the bitlines and wordlines, block 510. During the reading of the selected memory cell, a zero bias may be applied to some of the unselected memory cells (e.g., memory cells 111, 113, 117, 119) biased via the unselected wordlines (e.g., conductors 104 and 106) and the unselected bitlines (e.g., conductors 101 and 103), block 520. In this embodiment, the zero bias may be applied to the unselected memory cells by applying the predetermined voltage potential to the unselected wordlines and the unselected bitlines, block 520. In alternate embodiments, after the bitlines and wordlines of the array are charged to the predetermined voltage potential, the zero bias may be applied to the unselected memory cells by floating the unselected bitlines and the unselected wordlines.

A forward bias may be applied to the selected memory cell during the reading of the selected memory cell, block 530. In this embodiment, the forward bias may be applied to the selected memory cell by applying a read voltage potential (e.g., a voltage potential of approximately 1 volt) to the selected bitline, wherein the read voltage potential is less than a programming threshold (e.g., approximately 1.5 volts) of the selected memory cell. Although the scope of the present invention is not limited in this respect, the zero biasing of the unselected memory cells (e.g., block 520) and the forward biasing of the selected memory cell (e.g., block 530) may be simultaneous.

It should be pointed out that the precharging of the bitlines and wordlines prior to reading or programming, may improve performance of the memory device. In some embodiments the reading of a selected memory cell may be relatively fast. In these embodiments, the speed of the memory array may be improved since the bitlines and wordlines may be previously charged to the predetermined voltage potential. Also, in these embodiments, the power consumption may be improved since the leakage currents in the unselected memory cells may be reduced since some of the unselected memory cells are zero biased during the entire read operation.

Figure 6:
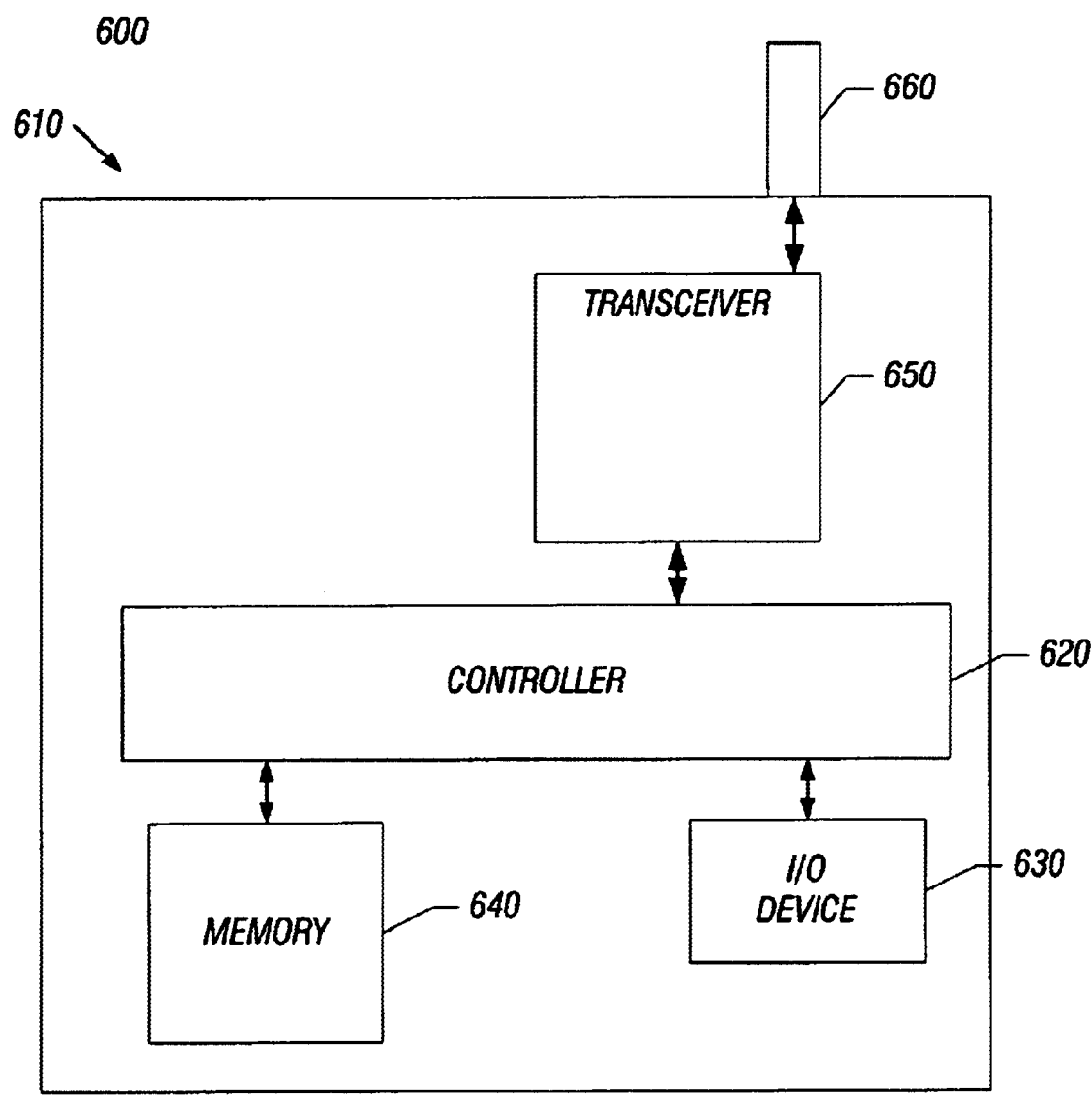
FIG. 6 is a block diagram of a system in accordance with an embodiment of the present invention.

In some diode-based memory array embodiments, a zero bias may be applied to some of the unselected memory cells during a read operation by applying the same voltage potential to the unselected wordlines and the unselected bitlines. In these embodiments, the voltage potential applied to the unselected wordlines and the unselected bitlines may be chosen to satisfy the following relationships: the potential difference between the voltage potentials applied to the unselected bitline and the selected wordline is less than the conducting threshold of a diode of the unselected memory cell; and the potential difference between the voltage potentials applied to the selected bitline and the unselected wordline is less than the conducting threshold of a diode of the unselected memory cell. In other words, in some embodiments, to zero bias some of unselected memory cells during reading of a selected memory cell, the voltage potentials applied to the unselected bitlines, the unselected wordlines, the selected bitlines, and the selected wordlines may be designed to satisfy the following 2 equations:

$$V_{UB}-V_{SW}<V_D \quad (1)$$

$$V_{SB}-V_{UW}<V_D \quad (2)$$

where:

$V_D$=turn-on voltage of diode in the unselected memory cell $V_{UB}$=voltage potential applied to the unselected bitline $V_{SW}$=voltage potential applied to the selected wordline $V_{SB}$=voltage potential applied to the selected bitline $V_{UW}$=voltage potential applied to the unselected wordline Turning to FIG. 6, an embodiment 600 in accordance with the present invention is described. Embodiment 600 may comprise a portable communication device 610. Portable communication device 610 may include a controller 620, an input/output (I/O) device 630 (e.g. a keypad, display), a memory 640, and a transceiver 650 that may be connected to an antennae 660, although the scope of the present invention is not limited to embodiments having any or all of these components.

Controller 620 may comprise, for example, one or more microprocessors, digital signal processors, microcontrollers, or the like. Memory 640 may be used to store messages transmitted to or by portable communication device 610. Memory 640 may also optionally be used to store instructions that are executed by controller 620 during the operation of portable communication device 610, and may be used to store user data. Memory 640 may be provided by one or more different types of memory. For example, memory 640 may comprise a volatile memory (any type of random access memory), a non-volatile memory such as a flash memory and/or a phase change memory such as, for example, phase change memory 33 illustrated in FIG. 2.

I/O device 630 may be used by a user to generate a message. Portable communication device 610 may use transceiver 650 with antennae 660 to transmit and receive messages to and from a wireless communication network with a radio frequency (RF) signal.

Although the scope of the present invention is not limited in this respect, portable communication device 610 may use one of the following communication protocols to transmit and receive messages: Code Division Multiple Access (CDMA), cellular radiotelephone communication systems, Global System for Mobile Communications (GSM) cellular radiotelephone systems, North 20 American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method, comprising: applying a zero bias to a first memory cell biased via first and second conductors, during the reading of a second memory cell having a phase change material, said second memory cell biased via third and fourth conductors.

2. The method of claim 1, wherein the applying comprises:

applying a first voltage potential to the first conductor; and applying the first voltage potential to the second conductor.

3. The method of claim 2, wherein the reading comprises:

applying a second voltage potential to the third conductor; and applying a third voltage potential to the fourth conductor.

4. The method of claim 3, wherein a difference between the first voltage potential and the third voltage potential is less than a conducting threshold of a diode of the second memory cell and wherein a difference between the second voltage potential and the first voltage potential is less than the conducting threshold of the diode of the first memory cell.

5. The method of claim 3, wherein the second voltage potential is less than a programming threshold of the second memory cell, wherein the programming threshold is a voltage potential sufficient to alter a state of the second memory cell.

6. The method of claim 5, further comprising charging the first conductor and the second conductor to the first voltage potential prior to the reading.

7. The method of claim 1, wherein the applying comprises:

floating the first conductor; and floating the second conductor.

8. The method of claim 7, wherein the floating the first conductor comprises disconnecting the first conductor from a source of operating potential.

9. The method of claim 1, further comprising applying a forward bias to the second memory cell during the reading of the second memory cell.

10. The method of claim 1, wherein the reading comprises determining a state of the second memory cell.

11. The method of claim 10, wherein the determining comprises determining a resistance of the phase change material of the second memory cell.

12. An apparatus, comprising:

a first memory cell biased using first and second conductors;

a second memory cell biased using third and fourth conductors, said second memory cell including a phase change material; and a circuit to apply a voltage potential difference of approximately zero across the first memory cell during the reading of the second memory cell.

13. The apparatus of claim 12, wherein the circuit applies the voltage potential difference of approximately zero across the first memory cell by applying a nonzero voltage potential to the first and second conductors.

14. The apparatus of claim 13, wherein the circuit applies a forward bias to the second memory cell during the reading of the second memory cell by applying a second voltage potential to the third conductor and a third voltage potential to the fourth conductor.

15. The apparatus of claim 14, wherein the second voltage potential is greater than the third voltage potential and a difference between the second voltage potential and the third voltage potential is less than a programming threshold of the second memory cell, wherein the programming threshold is a voltage potential sufficient to alter a state of the second memory cell.

16. The apparatus of claim 14, wherein the second memory cell comprises a diode and wherein a difference between the first voltage potential and the third voltage potential is less than a conducting threshold of the diode of the first memory cell and wherein a difference between the second voltage potential and the first voltage potential is less than the conducting threshold of the diode of the first memory cell.

17. The apparatus of claim 12, wherein the circuit is adapted to charge the first conductor and the second conductor to the nonzero voltage potential prior to the reading.

18. The apparatus of claim 12, further comprising a second circuit to read the second memory cell.

19. The apparatus of claim 18, wherein the second circuit comprises a comparator having a first input coupled to the second memory cell, a second input coupled to a reference signal, and an output.

20. A system, comprising:

a controller;

a transceiver coupled to the controller; and a memory coupled to the controller, and wherein the memory comprises:

a first memory cell biased using first and second conductors;

a second memory cell biased using third and fourth conductors, said second memory cell including a phase change material; and a circuit to apply a zero bias to the first memory cell during the reading of the second memory cell.

21. The system of claim 20, wherein the circuit applies the zero bias to the first memory cell by applying a first voltage potential to the first and second conductors and wherein the circuit applies a forward bias to the second memory cell during the reading of the second memory cell by applying a second voltage potential to the third conductor and a third voltage potential to the fourth conductor.

22. The system of claim 21, wherein the second voltage potential is greater than the third voltage potential and a difference between the second voltage potential and the third voltage potential is less than a programming threshold of the second memory cell, wherein the programming threshold is a voltage potential sufficient to alter a state of the second memory cell.

23. The system of claim 21, wherein the second memory cell comprises a diode and wherein a difference between the first voltage potential and the third voltage potential is less than a conducting threshold of the diode of the first memory cell and wherein a difference between the second voltage potential and the first voltage potential is less than the conducting threshold of the diode of the first memory cell.

* * * * *